United States Patent
Bohlmark et al.

(10) Patent No.: US 9,399,814 B2
(45) Date of Patent: Jul. 26, 2016

(54) COATED CUTTING TOOL

(71) Applicant: Lamina Technologies S.A., Yverdon-les-Bains (CH)

(72) Inventors: Johan Bohlmark, Stockholm (SE); Hermann Curtins, Baar (CH); Axel Kinell, Bandhagen (SE)

(73) Assignee: LAMINA TECHNOLOGIES S.A., Yverdon-les-Bains (CH)

( * ) Notice: Subject to any disclaimer, the term of this patent is extended or adjusted under 35 U.S.C. 154(b) by 0 days.

(21) Appl. No.: 14/345,532

(22) PCT Filed: Sep. 19, 2012

(86) PCT No.: PCT/EP2012/068455
§ 371 (c)(1),
(2) Date: Mar. 18, 2014

(87) PCT Pub. No.: WO2013/041576
PCT Pub. Date: Mar. 28, 2013

(65) Prior Publication Data
US 2014/0377023 A1 Dec. 25, 2014

(30) Foreign Application Priority Data
Sep. 19, 2011 (SE) ...................................... 1150851

(51) Int. Cl.
| | |
|---|---|
| *B23B 27/14* | (2006.01) |
| *C23C 14/06* | (2006.01) |
| *C23C 14/32* | (2006.01) |
| *C23C 14/58* | (2006.01) |
| *H01J 37/32* | (2006.01) |

(52) U.S. Cl.
CPC ........... *C23C 14/0641* (2013.01); *B23B 27/148* (2013.01); *C23C 14/325* (2013.01); *C23C 14/5886* (2013.01); *H01J 37/32055* (2013.01); *B23B 2224/24* (2013.01); *B23B 2228/105* (2013.01); *Y10T 407/27* (2015.01)

(58) Field of Classification Search
USPC ............ 51/307, 309; 428/332, 697, 698, 699, 428/701, 702, 704
See application file for complete search history.

(56) References Cited

U.S. PATENT DOCUMENTS

| | | | | |
|---|---|---|---|---|
| 6,033,734 | A * | 3/2000 | Muenz | C23C 14/022 204/192.16 |
| 6,395,379 | B1 * | 5/2002 | Braendle | 428/697 |
| 6,737,178 | B2 * | 5/2004 | Ota et al. | 428/698 |
| 6,824,601 | B2 * | 11/2004 | Yamamoto et al. | 428/699 |
| 6,838,151 | B2 * | 1/2005 | Kato | C23C 14/0641 407/119 |
| 7,083,868 | B2 * | 8/2006 | Horling et al. | 51/307 |

(Continued)

FOREIGN PATENT DOCUMENTS

| | | |
|---|---|---|
| EP | 1219723 A2 | 7/2002 |
| JP | 2000080466 | 3/2000 |

(Continued)

*Primary Examiner* — Archene Turner
(74) *Attorney, Agent, or Firm* — Robert C. Netter, Jr.; Dann, Dorfman, Herrell & Skillman

(57) ABSTRACT

The present invention provides a coated cutting tool comprising a substrate and a coating, where the coating comprises at least one compound layer deposited by cathodic arc deposition, which has a thickness of 10-30 μm characterized in that the coating has internal stress ranges from low tensile stresses, lower than 0.2 GPa, to compressive stresses, lower than 3 GPa.

16 Claims, 4 Drawing Sheets

(56) References Cited

U.S. PATENT DOCUMENTS

| | | | |
|---|---|---|---|
| 7,169,485 B2* | 1/2007 | Kohara | C23C 14/0641 428/699 |
| 7,767,319 B2* | 8/2010 | Åkesson | C22C 29/08 51/307 |
| 7,838,132 B2 | 11/2010 | Ahlgren et al. | |
| 8,034,438 B2* | 10/2011 | Sundstrom | C23C 30/005 428/336 |
| 8,216,702 B2* | 7/2012 | Johansson et al. | 51/309 |
| 8,283,058 B2* | 10/2012 | Martensson | C22C 29/08 428/697 |
| 8,304,098 B2* | 11/2012 | Kubota et al. | 428/697 |
| 8,389,108 B2* | 3/2013 | Moriguchi et al. | 428/698 |
| 8,409,702 B2* | 4/2013 | Ni et al. | 428/699 |
| 8,702,912 B2* | 4/2014 | Tabersky et al. | 204/192.1 |
| 8,871,340 B2* | 10/2014 | Setoyama et al. | 428/699 |
| 2008/0152882 A1 | 6/2008 | Selinder et al. | |
| 2008/0295658 A1* | 12/2008 | Donnadieu | C04B 35/581 83/13 |
| 2008/0298910 A1 | 12/2008 | Weber et al. | |
| 2009/0010724 A1* | 1/2009 | Norgren | B23C 5/202 407/119 |
| 2010/0215912 A1 | 8/2010 | Kubota et al. | |
| 2013/0202896 A1* | 8/2013 | Pettersson | B22F 7/06 428/448 |

FOREIGN PATENT DOCUMENTS

| | | | |
|---|---|---|---|
| JP | 2001322005 | | 11/2001 |
| WO | 2010/002344 | * | 1/2010 |

\* cited by examiner

COATED CUTTING TOOL

This application is a §371 application of PCT/EP2012/068455, filed Sep. 19, 2012, which in turn claims priority to SE Application 1150851-2, filed Sep. 19, 2011. The entire disclosure of each of the foregoing applications is incorporated by reference herein.

TECHNICAL FIELD

The present invention relates to a coated cutting tool comprising a substrate and a comparatively thick PVD coating.

BACKGROUND

Most cutting tools for turning, milling, drilling or other chip forming machining are today coated with a wear resistant coating deposited using chemical vapor deposition (CVD) or physical vapor deposition (PVD) techniques in order to prolong the service life of the tool and/or to increase the productivity. In general a comparatively thick coating is aimed for since this improves the wear resistance. This is readily accomplished for CVD coatings. However, PVD coatings have several attractive properties compared to CVD coatings, in particular the ability to provide compressive stress in the coating which gives improved toughness as compared to the CVD coatings. These compressive stresses essentially originate from differences in thermal expansion between substrate and coating and a densification effect due to a bombardment of high energy ions during deposition. This advantageous effect of ion bombardment is hardly present in all PVD techniques such as thermal evaporation, but prevails in sputter deposition and with cathodic arc deposition the compressive stress may become excessively high, often greater than 5 GPa, due to high kinetic energy of impinging ions. Biasing of the substrate is a standard way of increasing the kinetic energy and is for hard coatings considered necessary to obtain desired mechanical properties. The densification typically leads to increased hardness and improved wear resistance of the coating material. In combination with a potentially high deposition rate this makes the cathodic arc deposition techniques an interesting alternative for deposition of coatings for cutting tools.

However, due to too heavy ion bombardment defects may be generated and too high compressive stresses will eventually cause delamination of the coating, spontaneously or due to forces acting on the coating during machining, in particular for thick coatings. Thus the stress level in the coating is normally controlled to obtain highest possible compressive stress without impairing the adhesion of the coating too much. In particular flaking along the edge of a coated cutting tool insert is a well known problem. For example, U.S. Pat. No. 7,838,132 discloses cathodic arc deposition of about 3 μm thick (Ti,Al)N coatings on cemented carbide substrates using an arc current of 200 A at different substrate bias ranging from −40 V to −200 V and concludes that there is an optimum at about −70 V where high compressive stresses, i.e. more than 4 GPa, and still good adhesion can be achieved. Other sophisticated biasing techniques may enable stress relief and bond rearrangement during deposition and thereby allowing a comparatively high kinetic energy without severely suffering from delamination problems.

Consequently, prior art cathodic arc deposition processes suffer from a trade-off between coating thickness, which is crucial for wear resistance, and quality of the coating with respect to mechanical properties, in particular toughness.

SUMMARY OF THE INVENTION

One object of the invention is to improve wear resistance of coated cutting tools without deteriorating other properties such as flaking resistance. A further object is to provide a PVD coated tool suitable for turning in steel and other applications in which CVD coatings typically are used. This is accomplished by a coated cutting tool as defined by claim 1.

A coated cutting tool in accordance with one embodiment of the invention comprises a substrate and a coating, where the coating comprises at least one compound layer deposited by cathodic arc deposition and has a thickness of more than 5 μm, preferably more than 15 μm, more preferably more than 20 μm, even more preferably 10-30 μm. By thicknesses is for this purpose meant the thickness on the side of the coated cutting tool, i.e. either a flank side or a rake side, which has the thickest coating. The thickness is measured, preferably by light optical microscopy on polished cross sections, about 0.2 mm from the edge line. For irregular surfaces, such as those on e.g. drills and end mills, the thicknesses given herein refers to the thickness measured on any reasonably flat surface or a surface having a relatively large curvature and some distance away from any edge or corner. For instance, on a drill, the measurements should be performed on the periphery. The thickness exceeds coating thicknesses of state-of-the-art coated cutting tools produced by PVD and thereby gives superior crater wear resistance while still performing as good or better with respect to flank wear and flaking. The compound layer comprises at least one first element selected from Group 4, Group 5, Group 6 (IUPAC), Si, Al and Y, and at least one second element selected from N, B, O and C.

In one embodiment the compound layer comprises at least one first element selected from the group of Ti, Al, Si, Zr, Ta, Nb, W, Va, Hf, Y, Cr, more preferably nitrides of said at least one first element or combinations thereof, preferably with a composition selected from the group of (Ti, Al)N, (Ti, Al, Si)N, (Ti, Si)N, (Al, Cr)N, (Ti, Al, Cr)N, and (Ti, Al, Cr, Si)N which give hard wear resistant coatings, in particular with good abrasive wear resistance.

The compound layer may be provided in the form of a single layer or a multi-layer structure. By multilayer structure is herein meant a stack of individual layers, at least 5 up to several thousand individual layers, preferably comprising at least two repeatedly alternating individual layers having different properties with respect to e.g. composition. The repetition may be periodic or aperiodic. Contrary to the multi-layer structure the single layer has substantially the same properties throughout the thickness of the single layer. However, one or more properties may be varied continuously in part or throughout the thickness of the single layer, the individual layer of the multi-layer structure or the multi-layer structure. By way of example a compositional gradient may be formed.

In one embodiment the average composition of the compound layer is $(Ti_{1-a-b-c}Al_aCr_bSi_c)N$ where $0<a\leq0.7$, $0\leq b<0.5$, $0\leq c<0.17$ and $a+b+c<1$. By average composition is herein meant the composition measured on a section of a cross section of the coating. When measured by e.g. Energy-dispersive X-ray Spectroscopy (EDS) on a cross section of the coating the spatial resolution of the measurement may not be enough to resolve the composition of individual layers of a multi-layer structure without contribution from adjacent layers due to low layer thickness. What can readily be measured is the average composition over a section of the multi-layer structure including more than one individual layer.

In another embodiment of the invention the compound layer is a single layer of $Ti_{1-x}Al_xN$ with an average composition of $0.5<x<0.7$.

In yet another embodiment of the invention the compound layer is a single layer of $Ti_{1-x}Al_xN$ with an average composition of $0.3<x<0.5$.

Preferably the substrates of embodiments of the invention are uncoated or coated cutting tools, like cutting tool inserts, round tools such as drills, end mills, taps etc, and is made of any material known to be used in these applications such as cemented carbide, cermets, ceramics, cubic boron nitride, polycrystalline diamond or high speed steels. More preferably the substrate is made of cemented carbide, cermet or cubic boron nitride since these materials have thermal and mechanical properties that are essential to fully benefit from the advantageous properties of the coating layer deposited on the substrate such that the coated cutting tool obtain excellent wear resistance and toughness.

A cemented carbide substrate in accordance with one embodiment of the invention preferably comprises 5-13.5 wt-% Co and balance tungsten carbide (WC). Additionally, the elements Ti, Ta, V, Cr, Nb may be present.

A cemented carbide substrate in accordance with one embodiment of the invention preferably comprises tungsten carbide (WC) with a sub-micron grain size, 5-13.5 wt-% Co, preferably 6-10 wt-% Co, and Cr such that the Cr/Co ratio by weight is 0.04-0.15, and balance WC. Additionally, ppm levels of the elements Ti, Ta, or V. Preferably, the coercivity, Hc, of this fine-grained substrate ranges from 18-30 kA/m. Preferably the hardness of the substrate, HV3 is from 1500 up to 2200 kgf/mm$^2$, more preferably 1800-2200 kgf/mm$^2$.

The stress state of the compound layer and thereby the coating of the coated cutting tool in accordance with the invention is preferably controlled by means of deposition parameters and blasting as explained in the following. The blasting has the additional effect that it smoothens the as-deposited coating. The coating preferably has an internal stress ranging from compressive stress of less than 3 GPa to tensile stress of less than 0.2 GPa as determined by X-ray diffraction analysis. The surface areal roughness of the coating as measure by white light optical interferometry can be defined by standardized surface texture parameters (ISO 25178). Preferably the surface texture parameter Sa, defining the arithmetical mean height of the surface, is less than 0.4 µm, preferably less than 0.3 µm. In one embodiment of the invention the surface texture is further characterized in that the surface texture parameter Spd, defining the density of peaks, is less than $10 \times 10^3$/mm$^2$. In yet another embodiment of the invention the surface texture is further characterized in that the surface texture parameter Sdr, defining the developed area ratio, is less than 10%, preferably less than 6%.

The internal stress, a, of the coating of embodiments of the invention is evaluated by X-ray diffraction measurements using the well known sin$^2\psi$ method as described by I. C. Noyan, J. B. Cohen, Residual Stress Measurement by Diffraction and Interpretation, Springer-Verlag, New York, 1987 (pp 117-130). The measurements shall be performed using CuKα-radiation on the (Ti,Al)N (200) reflection, or the like for other compositions than (Ti,Al)N. It is recommended to use the side-inclination technique ($\psi$-geometry) with six to eleven, preferably eight, $\psi$-angles, equidistant within a selected sin$^2\psi$-range. An equidistant distribution of $\Phi$-angles within a $\Phi$-sector of 90° is preferred. To confirm a biaxial stress state the sample shall be rotated for $\Phi=0°$ and 90° while tilted in $\psi$. It is recommended to investigate the possible presence of shear stresses and therefore both negative and positive $\psi$-angles shall be measured. In the case of an Euler ¼-cradle this is accomplished by measuring the sample also at $\Phi=180°$ and 270° for the different $\psi$-angles. The measurement shall be performed on an as flat surface as possible, preferably on a flank side of an insert. For the calculations of the residual stress values the Possion's ratio, v=0.20 and the Young's modulus, E=450 GPa are to be used. Alternatively, Young's modulus, E, can be determined e.g. by nano-indentation technique. Preferably the data are evaluated using commercially available software such as DIFFRAC$^{Plus}$ Stress32 v. 1.04 from Bruker AXS preferably locating the (200) reflection by the Pseudo-Voigt-Fit function. In case of a biaxial stress state the total stress is calculated as the average of the obtained biaxial stresses.

In one embodiment of the invention the coating has a compressive stress being higher than 0.8 GPa, preferably higher than 1.3 GPa. By increasing the compressive stress the toughness can be improved.

In one embodiment of the invention the coating has a compressive stress being lower than 2.5 GPa, more preferably lower than 2 GPa. Thanks to this limitation of the compressive stresses in the coating and the advantageous properties of the cathodic arc deposition process a combination of high wear resistance and high flaking resistance can be obtained.

In one embodiment of the invention the internal stress of the coating is controlled to benefit from the effect of compressive stresses without suffering from delamination problems due to the thickness of the coating. Preferably the thickness of the coating is more than 5 µm, preferably more than 15 µm, more preferably more than 20 µm, even more preferably 10-30 µm and the internal stress of the coating is compressive stress ranging from 1 GPa to 2 GPa, preferably 1.3 GPa to 2 GPa.

In one embodiment of the invention the compound layer of the coating is a single layer of $Ti_{1-x}Al_xN$ with an average composition of $0.5<x<0.7$. The thickness of the coating is at least 6 µm, preferably more than 15 µm, the coating having compressive stress ranging from 1 GPa to 2 GPa, preferably 1.3 GPa to 2 GPa. The coating preferably has a predominant (200) texture, i.e. the intensity of (200) is significantly higher than the intensity of (111) as measured by X-ray diffraction. Preferably the surface areal roughness is smooth, i.e. Sa, is less than 0.4 µm, preferably less than 0.3 µm, Spd, is less than $10 \times 10^3$/mm$^2$, and Sdr, is less than 10%, preferably less than 6%. Preferably the substrate is made of cemented carbide, more preferably a fine-grained cemented carbide. This embodiment gives unexpected good result with respect to crater wear, flank wear and flaking. In another embodiment the compound layer is a single layer of $Ti_{1-x}Al_xN$ with an average composition of $0.3<x<0.5$, otherwise the same properties as the previous embodiment.

In yet another embodiment of the invention the compound layer of the coating is a multilayer with an average composition of $(Ti_{1-a-b}Al_aCr_b)N$ where $0<a<0.6$ and $0<b<0.15$. The thickness of the coating is at least 6 µm, preferably at least 10 µm, the coating having compressive stress ranging from 1 GPa to 2 GPa. Preferably the surface areal roughness is smooth, i.e. Sa, is less than 0.4 µm, preferably less than 0.3 µm, Spd, is less than $10 \times 10^3$/mm$^2$, and Sdr, is less than 10%, preferably less than 6%. Preferably the substrate is made of cemented carbide, more preferably a fine-grained cemented carbide.

In one embodiment of the invention the internal stress of the coating is controlled to be neutral to enable very thick coatings providing high wear resistance without suffering from delamination problems. Preferably the thickness of the coating is more than 15 µm, preferably more than 20 µm, even more preferably 10-30 µm, most preferably 20-30 µm and the coating has internal stresses ranging from low tensile stresses, lower than 0.2 GPa, to low compressive stresses, lower than 0.2 GPa.

In one embodiment the compound layer of the coating is a single layer of $Ti_{1-x}Al_xN$ with an average composition of $0.5<x<0.7$, a thickness of more than 15 µm, preferably 15-30 µm, even more preferably 10-30 µm, most preferably 20-30 µm, the coating having internal stress ranging from low tensile stresses, lower than 0.2 GPa, to low compressive stresses, lower than 0.2 GPa. The coating preferably has a predominant (200) texture. Preferably the surface areal roughness is smooth, i.e. Sa, is less than 0.4 µm, preferably less than 0.3 µm, Spd, is less than $10 \times 10^3/mm^2$, and Sdr, is less than 10%, preferably less than 6%. Preferably the substrate is made of cemented carbide, more preferably a fine-grained cemented carbide. This embodiment gives unexpected good result with respect to crater wear, flank wear and flaking.

In one embodiment the compound layer comprises a gradient with respect to the internal stress within the coating. This gradient can be determined by control of the deposition conditions and/or the post-treatment blasting. By way of example the bias voltage can be varied during deposition to accomplish an internal stress gradient, by way of example linearly increasing the bias voltage yielding a substantially linear change in internal stress towards higher compressive stress towards the outer surface of the compound layer or the bias voltage can be increased exponentially yielding a steep increase of the internal stress towards higher compressive stress in the outermost part of the compound layer whereas the compressive stress in the inner part of the compound layer is low or even tensile.

The compound layer may be an innermost layer, closest to the substrate. It may also be an outermost layer of the coating. The coating may comprise of more layers than said at least one compound layer, such as one or more intermediate layers between the substrate and the compound layer or an outermost layer deposited on the compound layer.

Thanks to the invention it is possible to provide a PVD coated cutting tool insert that outperforms conventional PVD coated cutting tools with respect to crater wear, flank wear without suffering from flaking and that has a crater wear resistance comparable to a state-of-the-art CVD coated cutting tool.

A method for cathodic arc deposition within a vacuum chamber of a coating comprising at least on compound layer on a substrate in accordance with the invention comprises generating a plasma from an arc discharge visible as one or more arc spots on a surface of a plate-shaped target by applying an arc current of at least 200 A between the plate-shaped target, which acts a cathode, and an anode arrangement such that ions of the arc discharge are emitted out from the plate-shaped target to contribute in forming the coating the substrate.

It has been found that an ion current density at the surface of the substrate to be coated is of significant importance for the properties of the coating. One measure of the ion current density is the total ion current produced by one or more plate-shaped targets. The total ion current can be estimated by measuring the ion current density with a probe surface negatively biased relative a voltage potential of the anode arrangement and facing the plate-shaped target at a distance of about 15 cm from the target surface, and multiplying the measured ion current density with the total surface area of the plate-shaped target. Preferably the total ion current is at least 5 A.

It has been found that sufficiently high total ion current is not readily accomplished using a small target since the power density of the arc typically becomes be too high to be able to efficiently control the evaporation of target material and hence an unacceptable number of droplets would be emitted from the target surface, which is detrimental to the coating quality. By using a comparatively large target surface area, current density and local thermal load on the target can be kept at moderate levels, while providing the high total ion current.

The surface area of the plate-shaped target is preferably larger than 500 $cm^2$, more preferably larger than 1000 $cm^2$. Thereby branching of the arc discharge into a multitude of arc spots distributed over substantially the whole surface area of the target is possible. The branching is promoted by the high arc current. One advantage of the branching is that it gives a comparatively uniform ion current density in the plasma over the whole surface area of the target. This can be observed as a substantially uniform illumination of the target surface during deposition. Another advantage of the branching is that it enables improved target utilization. Yet another advantage is that it is possible to obtain uniform deposition conditions in the whole vacuum chamber and hence uniform coating thickness and properties within a batch of substrates to be coated.

Preferably the measured ion current density, which is measured at saturation conditions of the current, is larger than 6 $mA/cm^2$, more preferably larger than 10 $mA/cm^2$, and even more preferably between 6 $mA/cm^2$ to 16 $mA/cm^2$ in order to obtain the high total ion current and to get a high ion flux at the substrates. Additional plate-shaped targets may be provided, e.g. to further increase ion current supplied to the plasma formed, or to provide plate-shaped targets with different composition.

The arc discharge supplies ions to the plasma. One measure of the amount of ions that are supplied to the plasma is the total ion current from the plate-shaped target as defined above. With a plurality of plate-shaped targets the supply of ions can be determined by summarizing the total ion current from each of the plate-shaped targets. Preferably the sum of total ion currents from a respective plate-shaped target divided by the volume of the vacuum chamber is at least 3 $A/m^3$.

The method comprises applying a voltage potential difference between the substrate and the plate-shaped target, i.e. a bias voltage $V_S$ to the substrate being negative relative a voltage potential $V_A$ of the anode arrangement and a cathode voltage $V_C$ being negative relative the voltage potential $V_A$ of the anode arrangement. As mentioned above, this is known to have an effect on the stress state of the coating, and commonly high bias voltage levels are used to obtain high compressive stresses. However, it has been found that the objectives of the present invention may be accomplished if the substrate is biased at a comparatively low bias level. Preferably voltage differences are $V_S-V_A>-30$ V, $-20$ V$<V_C-V_A<0$ V, and $-10$ V$\leq V_S-V_C \leq 10$ V. In one example of the method $V_S-V_C \leq 0$ V. In another example $-19$ V$\leq V_C-V_A \leq -15$V, preferably $-18$ V$\leq V_C-V_A \leq -16$V. In yet another example $-30$ V$\leq V_S-V_A \leq -15$V, preferably $-25$V$\leq V_S-V_A \leq -15$ V. For the purpose of this application the bias voltage $V_S$ is intended to be a peak voltage.

Ions impinging on the substrate will due to the comparatively low voltage biasing of the substrate have a moderate kinetic energy, contrary to the above-mentioned prevalent strive to increase the kinetic energy of the ions in order to increase ion mobility and thereby improve mechanical properties. However, due to the high ion current density a high ion flux is provided at the surface of the substrate such that the total energy transferred from ions arriving at the substrate surface is still high thereby enhancing ion mobility at the surface which improves the mechanical properties without introducing detrimental high stress levels and/or defects in the coating. Thereby the stress state in the coating can be efficiently controlled.

By increasing the arc current the total ion current increases and the deposition rate increases. The increase of the current also promotes branching of the arc discharge. Preferably the arc current that generates the arc plasma is at least 400 A per plate-shaped target, preferably at least 800 A, more preferably 400-1200 A.

Normally, in prior art cathodic arc deposition systems, chamber walls of the vacuum chamber act as anode for all targets. A deposition system for depositing a coating in accordance the invention preferably comprises an anode arrangement comprising an anode member with an anode surface directed towards the plate-shaped target and arranged concentrically with each plate-shaped target and extending laterally along a rim thereof. The large anode surface is provided close to the target and the anode surface area is fairly constant along the whole length of the plate-shaped target in order to provide uniform plasma conditions along the whole length, irrespective of conditions elsewhere in the vacuum chamber. The anode member is preferably substantially interrupted in a section of the rim extending at least partly along the width of the target on each side of the plate-shaped target in the end portions thereof in order to tailor the shape and size of the anode surface such that the plasma conditions are uniform also in the end portions. The anode member may further comprise an anode surface that tapers outwards as the anode member extends away from the plate-shaped target in the normal direction thereof.

The anode member of the present invention may further serve to contribute to a balanced electromagnetic field over the whole plate-shaped target. This total electromagnetic field is further influenced by a magnetic self-field originating from the arc current, a magnetic field originating from the means for generating a magnetic field, and a magnetic field originating from current mating of the plate-shaped target. One advantage the balanced electromagnetic field is that the erosion of the plate-shaped targets becomes uniform and the target utilization is improved as compared to conventional deposition systems, in particular for high arc currents above 200 A.

The deposition system may further comprise means for generating a lateral magnetic field on the target surface. This lateral magnetic field can be used to steer the displacement of the arc spot(s) of the arc plasma. Preferably, the magnetic field originating from means for generating a magnetic field is moderate, preferably less than 100 Gauss, more preferably 5-40 Gauss. This results in a weak steering of the arc discharge, i.e. branches of the arc discharge, around the plate-shaped target.

The impedance, which is determined by measuring the average voltage and arc current over the anode arrangement and the plate-shaped target, is preferably controlled to be within a predetermined range, preferably less than 0.1 Ohm, more preferably less than 0.05 Ohm, during deposition. This is accomplished at least partly by using a comparatively weak lateral magnetic field for steering the arc discharge, contrary to steered arc techniques where a strong magnetic field is used. These steered arc techniques are conventional ways to slightly increase the arc current, however not readily above 200 A, without impairing the coating properties by increased droplet formation. Likewise, with the anode-cathode configuration described above and the low impedance approach the arc current can be increased to give effective multi-branching of the arc discharge and a dense plasma in order to give a high deposition rate and without impairing coating properties.

However, it should be appreciated that the impedance is not only determined by the magnetic field applied, but also other parameters such as anode placement, anode design, gas pressure, cathode design, etc. Therefore, all parameters should be considered when limiting the impedance.

Weak magnetic steering and well-defined electrical field between anode and cathode improve target utilization since it prevents problems associated with random arc and conventional steered arc techniques. For example, as compared to the latter the typical race track in the target is prevented due to uniform distribution of arc spots and efficient branching of the arc over the target surface.

By combining the weak magnetic steering with the anode member having a large anode surface close to the target and providing uniform plasma conditions with respect to magnetic field and geometrical arrangement of cathode surface and anode surface around the target, and in particular in the end portions of the plate-shaped target, the anode current density around the target can be kept constant, which enables higher currents and uniform erosion around the target.

By balancing of the magnetic field with respect to magnetic self-field originating from arc current, magnetic field originating from means for generating a magnetic field, and a magnetic field originating from current mating of the target over the whole surface of the plate-shaped target the erosion of the plate-shaped target transversely to a track around the plate-shaped target is more uniform. Hence, it is possible to improve target utilization.

The method may further comprise changing the voltage bias gradually during deposition to control the internal stress of the compound layer. Preferably the voltage bias is increased during deposition. The voltage bias may be increased linearly, or progressively, e.g. exponentially.

Preferably deposition is performed until a thick coating has been formed, preferably a thickness of at least 5 μm, more preferably at least 15 μm, even more preferably at least 20 μm. As appreciated by one skilled din the art the deposition process can be varied to accomplish single-layered or multi-layered coatings. Multilayer structures can be accomplished by methods known in the art, by way of example targets of different composition and rotating the substrates to be coated in front of the targets.

The method may further comprise different pre-treatment or post-treatment steps.

One example is a pre-treatment comprising subjecting the substrate blasting, preferably a two-step blasting operation including a first dry blasting step to provide an edge rounding of the substrate followed by a second wet blasting step to remove residues from the dry blasting step. However, the blasting can be performed with either dry blasting or wet basting as well. The parameters for pre-treatment blasting can be varied and is well known to a person skilled in the art.

In another example the coating formed by one or more of the above described steps is subjected to a post-treatment comprising blasting, alternatively shot-peening or the like. In one aspect the blasting may provide a smoother surface. In another aspect the blasting may change the stress state in the coating, e.g. increasing the compressive stresses in the coating. Both aspects may contribute to an improved performance of the coated cutting tool formed by deposition in accordance with embodiment of the invention, in particular for thick coatings. Due to a combination controlling the stress state using the deposition parameters, such as the pressure, the ion current density and the bias, and the post-treatment blasting control of the stress state of the coating can be improved which yields an unexpected good performance of the coated cutting tool.

Preferably the coating is subjected to wet blasting using a nozzle arranged at a distance of about 20-300 mm, preferably 40-200 mm, and an angle of about 0-90°, preferably 35-65°, relative the rake side of the substrate and 100-800 mesh particles, preferably 300-500 mesh, at a pressure of about 0.1-0.6 MPa. The duration of the wet blasting of the coating is preferably about 0.5-1 minutes. Suitable particles to be used includes, however not limited to, alumina, silicon carbide and zirconia.

In blasting, a blasting medium, such as particles, are impinging on the substrate with high velocity, typically in an abrasive manner. As mentioned above, the blasting may be performed either under dry conditions, i.e. with the particles or the like as a powder, or wet conditions, i.e. with the particles or the like suspended in a fluid. Depending on the blasting conditions, with respect to blasting medium, pressure, angle and duration, the effect of blasting will vary. The blasting process may for example be adjusted to smoothen or roughen the surface of the substrate. As mentioned above the blasting can also change the stress state of the as-deposited coating. As appreciated by one skilled in the art this change can be tailored by e.g. selecting particular blasting medium, duration, angle, pressure etc.

As appreciated by one skilled in the art the deposition process may comprises different plasma etching steps, prior to, during or subsequent to deposition of the compound layer or individual layers thereof.

Other objects, advantages and novel features of the invention will become apparent from the following detailed description of the invention when considered in conjunction with the accompanying drawings and claims.

BRIEF DESCRIPTION OF DRAWINGS

Embodiments of the invention will now be described with reference to the accompanying drawings, wherein.

DETAILED DESCRIPTION

Figure 1A:
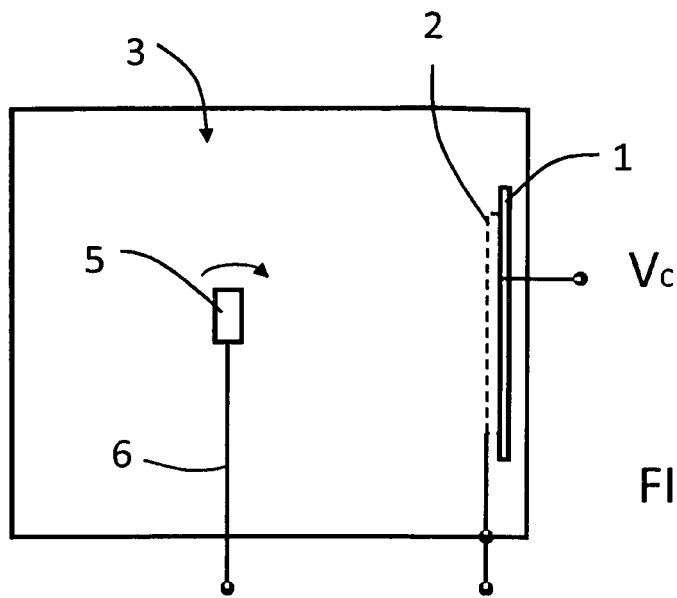
FIG. 1 is a schematic illustration of a deposition system for manufacturing a coating in accordance with the invention.
Figure 1B:
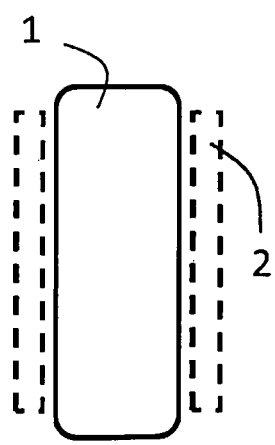
Figure 1B:
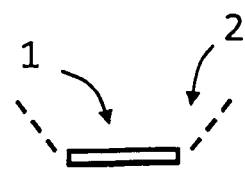
Figure 2:
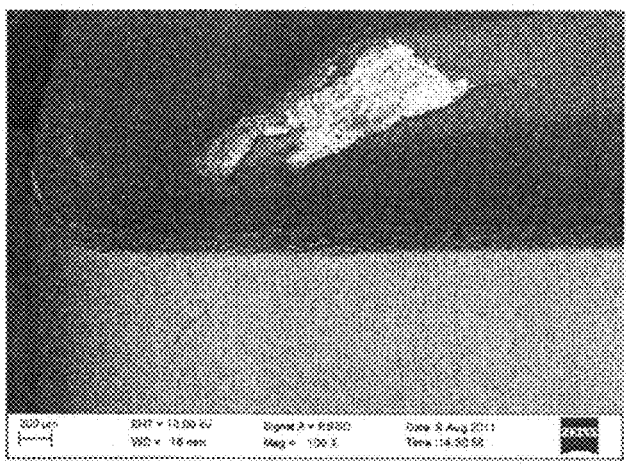
FIG. 2 is a scanning electron microscope image of a (Ti, Al)N coated cutting tool in accordance with one embodiment of the invention (Example 1) after turning in steel.
Figure 3:
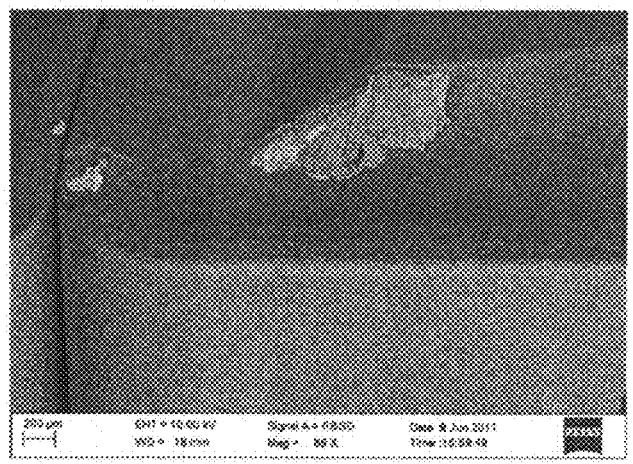
FIG. 3 is a scanning electron microscope image of a (Ti, Al)N coated cutting tool in accordance with one embodiment of the invention (Example 3) after turning in steel.
Figure 4:
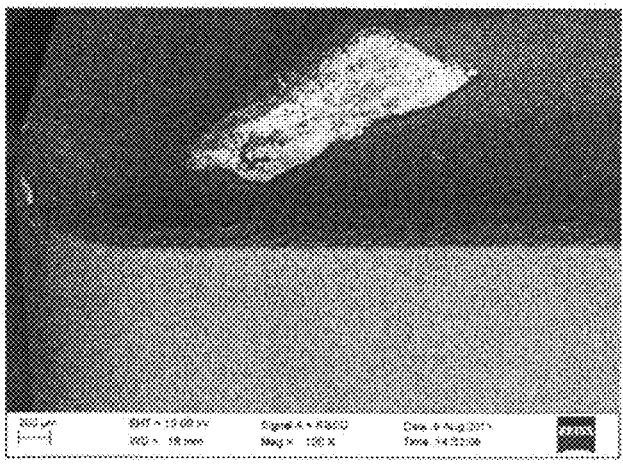
FIG. 4 is a scanning electron microscope image of a (Ti, Al)N coated cutting tool in accordance with one embodiment of the invention (Example 7) after turning in steel.

FIG. 1a schematically illustrates one example of deposition system for cathodic arc deposition of a coating in accordance with the invention. FIG. 1b shows front view and top view of a plate-shaped target 1 and an anode member. The manufacturing of the coating is herein described with reference to this non-limiting example, however, as appreciated by one skilled in the art, the deposition system can be modified in different ways. As in other PVD depositions systems the deposition of the coating is performed within a vacuum chamber 3 coupled to vacuum pumps (not shown) to control the pressure within the vacuum chamber 3. One or more plate-shaped targets 1 acting as sources of coating material in the deposition process are provided in or on the walls of the vacuum chamber 3 with their target surfaces facing the interior of the vacuum chamber 3. The plate-shaped targets 1 and an anode arrangement, preferably including the anode member 2, are connected to an arc power supply (not shown) and form cathode and anode of the deposition system, respectively. An arc discharge is used to evaporate target material. The arc discharge is triggered by a trigger (not shown). A substrate 5 to be coated is preferably carried by a fixture 6 in the vacuum chamber 3 in line-of-sight from the plate-shape targets 1. In order to uniformly coat all sides of the substrate 5 the fixture may be rotatable. The substrates 5 may be connected via the fixture 6 to a bias voltage power supply. The deposition may be performed in a reactive atmosphere such that evaporated target material and a reactive gas supplied through a gas inlet into the vacuum chamber 3 react to form a compound coating.

The bias voltage can be provided by a bias voltage power supply. The bias voltage may be a DC voltage or a pulsed voltage. In a deposition system adapted for a pulsed bias voltage the bias voltage power supply, comprises a pulse generating unit. The bias voltage power supply is preferably connected to a control unit that monitors the bias voltage output from the bias voltage power supply during deposition and adjusts the power supply to obtain the desired bias voltage level.

Preferably the arc current is a direct current supplied by a power supply connected to the deposition system. The direct current is not necessarily constant over time. Although the arc current may show considerable variation during deposition due to individual contribution from the short-lived arc discharges, this direct current should not be mixed-up with pulsed deposition techniques. Pulsed deposition can be used for the same reasons as in prior art deposition processes.

To accomplish impedance control the deposition system may comprise a control unit and an impedance monitoring unit, arranged such that the control unit based on the measurement of the impedance between the anode and the plate-shaped target by the impedance control unit adjusts the magnitude of the lateral magnetic field generated by means for generating a lateral magnetic field in order to keep the impedance within a predetermined range. The control unit may be automatically or manually controlled.

Balancing of magnetic self-field originating from arc current, magnetic field originating from means for generating a magnetic field, and a magnetic field originating from current mating of the target is preferably performed by an empirical, iterative process aiming at accomplishing a uniform distribution of the arc spots over the whole surface of the plate-shaped target.

Balancing of non-uniform magnetic fields originating from the current mating can be accomplished by providing an asymmetric distribution of permanent magnets under the plate-shaped target. By way of example, a cathode arrangement of a deposition system may comprise plate-shaped target arranged on a conductive back plate. The back plate may comprise at least two current bars running along the length thereof. These current bars are connected to the arc power supply in opposite ends of the plate-shaped target and current. Hence the arc current enters the current bars from opposite ends of the plate-shaped target and is spread via the current bars and the conductive back plate to the plate-shaped target. With this configuration the current density in each current bar is higher close to the current input to the current bar and is depleted towards the opposite end. Consequently the magnetic field originating from the current mating through the current bars is also decreasing along the current bar. The effect of this can be balanced using asymmetrically distributed permanent magnets arranged such that the magnetic field around the plate-shaped target becomes uniform.

FIG. 1a schematically illustrates a side view of the anode member used in the following examples. FIG. 1b schematically illustrates front view and top view of the anode member and the plate-shaped target. The anode member is substantially interrupted in a section extending at least partly along the width of the plate-shaped target in opposite end portions of the plate-shaped target. Further the anode member comprises an anode surface that tapers outwards as the anode member extends away from the plate-shaped target in the normal direction thereof.

In the following, Examples 1-7 disclose embodiments of the invention and Examples 8-10 disclose reference samples representing state-of-the-art, which in Examples 11-13 are compared with respect to crater wear, flank wear and flaking. Substantially the same deposition process has been used for all the samples of Examples 1-7, and is described hereinafter.

The coatings of Examples 1-7 was deposited on a substrate using a cathodic arc deposition system comprising one or more comparatively large plate-shaped targets as described above. The substrate 5 to be coated is carried by a fixture 6 in line-of-sight from the plate-shape targets 1. In order to uniformly coat all sides of a substrate 5 the fixture is rotatable. The substrates 5 are connected via the fixture 6 to a bias voltage power supply. The deposition is performed in a reactive atmosphere such that evaporated target material and a reactive gas supplied through a gas inlet into the vacuum chamber 3 react to form a compound coating.

The substrates used in the examples are all CNMG120408 inserts of three different compositions, hereinafter referred to as substrates S1, S2 and S3, respectively. These substrates are specified in Table 1.

TABLE 1

|  | S1 | S2 | S3 |
|---|---|---|---|
| Co (wt-%) | 6.0 | 7 | 10 |
| Cr (wt-%) | 0.4 | 0.7 | 0.4 |
| Ti (wt-%) | 0.06 | 0.01 |  |
| Ta (wt-%) |  | 0.01 |  |
| V (wt-%) | 0.1 |  |  |
| W (wt-%) | balance | balance | balance |
| Hc (kA/m) | 27.6 | 27.8 | 20.5 |
| HV3 (kgf/mm$^2$) | 1970 | 1890 | 1600 |

The coercivity value, Hc, was measured using a Foerster Koerzimat CS1.096 according to DIN IEC 60404-7.

EXAMPLE 1

A (Ti,Al)N coating was deposited on a S1 substrate in a nitrogen atmosphere using five plate-shaped targets, each plate-shaped target comprising 40 at-% Ti and 60 at-% Al.

Prior to loading the substrate into the deposition system the substrate was subjected to dry blasting to obtain a honing to an edge radius of 30-60 μm followed by wet blasting to clean the substrate from residues from the dry blasting step. The dry blasting was performed using a nozzle with diameter 10 mm arranged at a distance of about 150 mm and an angle of about 45° relative the rake side of the substrate and 100 mesh alumina particles at a pressure of about 0.4-0.6 MPa, i.e. the particles impinging with a 45° angle on the rake side of the substrate. The wet blasting was performed using a nozzle with diameter 9.5 mm arranged at a distance of about 150 mm and an angle of about 45° relative the rake side of the substrate and 360 mesh alumina particles at a pressure of about 0.4 MPa. The duration of the wet blasting of the substrate was about 0.5-1 minutes.

The substrate was horizontally arranged, i.e. with their flank faces facing the plate-shaped targets, on fixtures enabling threefold rotation in the deposition system. Prior to deposition the substrate was plasma etched by bombarding the substrates with Cr-ions in the deposition system.

The coating was deposited using the following deposition conditions: temperature 450° C., nitrogen pressure 5 Pa, arc current 400 A, bias voltage 35.5 V (DC) and cathode voltage 17.5 V.

After deposition the coating was subjected to wet blasting using a nozzle with diameter 9.5 mm arranged at a distance of about 150 mm and an angle of about 45° relative the rake side of the substrate and 360 mesh alumina particles at a pressure of about 0.4 MPa. The duration of the wet blasting of the coating was about 0.5-1 minutes.

The thickness of the coating was 22 μm on the flank side and 16 μm on the rake side. The hardness was 31 GPa. The internal stress after the wet blasting of the coating was −1430 MPa.

EXAMPLE 2

A (Ti,Al)N coating was deposited on a S2 substrate in a nitrogen atmosphere using five plate-shaped targets, each plate-shaped target comprising 40 at-% Ti and 60 at-% Al.

Prior to deposition, the substrate was subjected to pre-treatment, horizontally arranged and plasma etched in accordance with Example 1. The coating was deposited using the following deposition conditions: temperature 450° C., nitrogen pressure 5 Pa, arc current 400 A, bias voltage 35.5 V (DC) and cathode voltage 17.5 V. After deposition the coating was subjected to post-treatment in accordance with Example 1.

The thickness of the coating was 14 μm on the flank side and 8 μm on the rake side. The hardness was 31 GPa. The internal stress after wet blasting of the coating was −1950 MPa. Areal surface roughness of the coated cutting tool was measured on the rake side using a white light interferometer (Wyko NT9100, Veeco Instruments Ltd). A Gaussian band-pass filter that rejects wavelengths above 0.08 mm was used for the analysis. The arithmetical mean height of the surface, Sa, was 0.27 μm, the developed area ratio, Sdr, was 5.2%, and the density of peaks, Spd, was $6.1 \times 10^3$ 1/mm$^2$.

For comparison a coated cutting tool produced in the same process and with the same substrate as the coated cutting tool of this Example 2, except for being post-treated by blasting was evaluated with respect to the surface areal roughness. The arithmetical mean height of the surface, Sa, was 0.36 μm, the developed area ratio, Sdr, was 24.6%, and the density of peaks, Spd, was $20.9 \times 10^3$ 1/mm$^2$.

EXAMPLE 3

A (Ti,Al)N coating was deposited on a S1 substrate in a nitrogen atmosphere using one plate-shaped target comprising 40 at-% Ti and 60 at Al.

Prior to deposition, the substrate was vertically arranged, i.e. with the rake face facing the plate-shaped target, and thereafter subjected to pre-treatment and plasma etched in accordance with Example 1. The coating was deposited using the following deposition conditions: temperature 450° C., nitrogen pressure 2.5 Pa, arc current 400 A, bias voltage 19 V (DC) and cathode voltage 17.5 V. After deposition the coating was subjected to wet blasting using a nozzle with diameter 12.5 mm arranged at a distance of 50 mm and an angle of about 45° relative the rake side of the substrate and 500 mesh alumina particles at a pressure of about 0.4 MPa for about 0.5 minutes.

The thickness of the coating was 21 μm on the flank side and 24 μm on the rake side. The hardness was 27 GPa. The internal stress after wet blasting of the coating was +90 MPa.

EXAMPLE 4

A multilayer (Ti,Al,Cr)N coating was deposited on a S1 substrate in a nitrogen atmosphere using five plate-shaped targets, each of said five plate-shape targets comprising 40 at-% Ti and 60 at-% Al, running simultaneously with a plate-shaped target comprising 100 at-% Cr.

Prior to deposition, the substrate was subjected to pre-treatment, horizontally arranged and plasma etched in accordance with Example 1. The coating was deposited using the following deposition conditions: temperature 450° C., nitrogen pressure 2.5 Pa, am current for the (Ti,Al) target 400 A, arc current for the Cr target 100 A, bias voltage 19 V (DC) and cathode voltage 17.5 V. After deposition the coating was subjected to post-treatment in accordance with Example 1.

The thickness of the coating was 16 μm on the flank side and 11 μm on the rake side. The hardness was 31 GPa. The internal stress after wet blasting of the coating was −1340 MPa.

EXAMPLE 5

A TiAlN coating was deposited on a S3 substrate in a nitrogen atmosphere using three plate-shaped targets, each of said three plate-shape targets comprising 60 at-% Ti and 40 at-% Al.

Prior to loading the substrate into the deposition system the substrate was subjected to dry blasting to obtain a honing to an edge radius of 30-60 μm followed by wet blasting to clean the substrate from residues from the dry blasting step. The dry blasting was performed using a nozzle with diameter 10 mm arranged at a distance of 150 mm and an angle of 45° relative the rake side of the substrate and 100 mesh alumina particles at a pressure of about 0:4-0.6 MPa. The wet blasting was performed using a nozzle with diameter 12.5 mm arranged at a distance of 50 mm and an angle of about 45° relative the rake side of the substrate and 500 mesh alumina particles at a pressure of about 0.4 MPa for about 0.5 minutes.

Prior to deposition, the substrate was horizontally arranged and plasma etched in accordance with Example 1. The coating was deposited using the following deposition conditions: temperature 450° C., nitrogen pressure 3.5 Pa, arc current 400 A, bias voltage 20.5 V (pulsed bias, 80% duty cycle) and cathode voltage 17.5 V. After deposition the coating was subjected to post-treatment in accordance with Example 3.

The thickness of the coating was 23 μm on the flank side and 15 μm on the rake side. The internal stress was +900 MPa after deposition, prior to blasting. The internal stress after blasting of the coating was −1585 MPa. The hardness of the coating was 26 GPa.

EXAMPLE 6

A (Ti,Al)N coating was deposited on a S1 substrate in a nitrogen atmosphere using three plate-shaped targets, each of said plate-shape targets comprising 40 at-% Ti and 60 at-% Al.

Prior to deposition, the substrate was subjected to pre-treatment, horizontally arranged and plasma etched in accordance with Example 1. The coating was deposited using the following deposition conditions: temperature 450° C., nitrogen pressure 5.0 Pa, arc current 400 A and cathode voltage 17.5 V. During deposition the bias voltage was increased linearly from 20.5 V, at the beginning of deposition, to 36.5 V at the ending of deposition. After deposition the coating was subjected to post-treatment in accordance with Example 1.

The thickness of the coating was 19 μm on the flank side and 13 μm on the rake side. The internal stress was −1700 MPa after deposition, prior to blasting. The internal stress after wet blasting of the coating was −2580 MPa. Due to this high stress level the coating formed by the above process parameters may spontaneously flake along the cutting edge. This has not been observed for the other Examples of embodiments of the invention since the overall stress level is lower for the coatings thereof. However, a high stress level in the outermost part of the coating can be provided if the stress level in the inner part of the coating is comparatively low, see Example 7. The maximum stress level is also dependent on the thickness of the coating.

EXAMPLE 7

A (Ti,Al)N coating was deposited on a S1 substrate in a nitrogen atmosphere using one plate-shaped target, each of said plate-shape targets comprising 40 at-% Ti and 60 at-% Al.

Prior to deposition, the substrate was subjected to pre-treatment, horizontally arranged and plasma etched in accordance with Example 1. The coating was deposited using the following deposition conditions: temperature 450° C., nitrogen pressure 5.0 Pa, arc current 400 A and cathode voltage 17.5 V. During deposition the bias voltage was increased exponentially from 20.5 V, at the beginning of deposition, to 36.5 V at the ending of deposition. After deposition the coating was subjected to post-treatment in accordance with Example 1.

The thickness of the coating was 18 μm on the flank side and 12 μm on the rake side. The internal stress was −965 MPa after deposition, prior to wet blasting of the coating. The internal stress after wet blasting of the coating was −1800 MPa.

EXAMPLE 8

A single layer of (Ti,Al)N was deposited on a S2 substrate by cathodic arc deposition in a Balzers Rapid Coating System in a nitrogen atmosphere using targets with the composition $Ti_{0.33}Al_{0.67}$. The thickness of the coating was 3 μm

EXAMPLE 9

A TiAlN multilayer coating with a TiN/(Ti,Al)N multi-layer structure repeatedly alternated with a (Ti,Al)N single layer was deposited on a S2 substrate using cathodic arc deposition in a Balzers Rapid Coating System in a nitrogen atmosphere. The TiN/(Ti,Al)N multilayer structure was deposited using Ti and $Ti_{0.5}Al_{0.5}$ targets and the (Ti,Al)N single layer was deposited using $Ti_{0.5}Al_{0.5}$ targets. The coating thickness was 4 μm.

EXAMPLE 10

A commercial state-of-the-art CVD coated cutting tool for turning applications with a cemented carbide substrate and a MT-TiCN+α-$Al_2O_3$+TiN coating was used for comparison.

EXAMPLE 11

Inserts from Examples 1-10 were tested with respect to crater wear by turning in bearing steel (Ovako 825B, Tibnor). The result is presented in Table 2. Tool life criterion was crater wear exceeding 0.5 mm².

TABLE 2

| | Example | | | | | | | | | |
|---|---|---|---|---|---|---|---|---|---|---|
| | 1 | 2 | 3 | 4 | 5 | 6 | 7 | 8 | 9 | 10 |
| Tool life (min) | 20 | 14 | n.a. | 10 | 22 | n.a. | n.a. | 2 | 10 | >30 |

EXAMPLE 12

Inserts from Examples 1, 2, 4, 5 and 8-10 were tested with respect to flank wear by longitudinal turning in tool steel (Sverker21, Uddeholm). The result is presented in Table 3. Tool life criterion was flank wear exceeding 0.2 mm.

TABLE 3

| | Example | | | | | | | | | |
|---|---|---|---|---|---|---|---|---|---|---|
| | 1 | 2 | 3 | 4 | 5 | 6 | 7 | 8 | 9 | 10 |
| Tool life (min) | 26 | 28 | n.a. | 18 | 12 | n.a. | n.a. | 16 | 8 | 12 |

EXAMPLE 13

Inserts from Examples 1, 3, 4 and 9 were tested with respect to flaking by turning in austenitic stainless steel (304L, Sandvik).

The extent of flaking was qualitatively determined using a scanning electron microscope (SEM). FIG. 2, FIG. 3, FIG. 4 and FIG. 5 are SEM images of the inserts of Example 1, Example 3, Example 7 and Example 9, respectively. Inserts of Example 1, 3 and 7 in accordance with embodiments of the invention do not show any flaking down to the substrate. Inserts of Example 9 in accordance with prior art show severe flaking along the cutting edge, although having much thinner coating than in Example 1.

The performance of a coated cutting tool in accordance to the invention with respect to crater wear, flank wear and flaking shown in the above examples 11-13 makes clear that the coating and the coated cutting tool in accordance with the present invention has excellent toughness and wear resistance. In particular the flaking resistance of such a thick coating is unexpected good.

EXAMPLE 14

Figure 5:
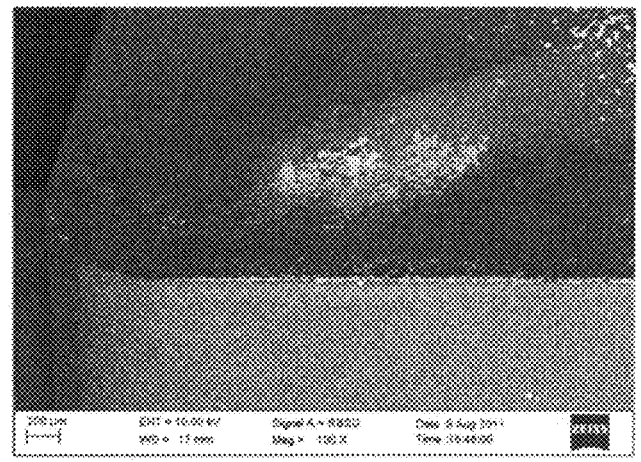
FIG. 5 is a scanning electron microscope image of a (Ti, Al)N coated cutting tool in accordance with prior art (Example 9) after turning in steel.
Figure 6A:
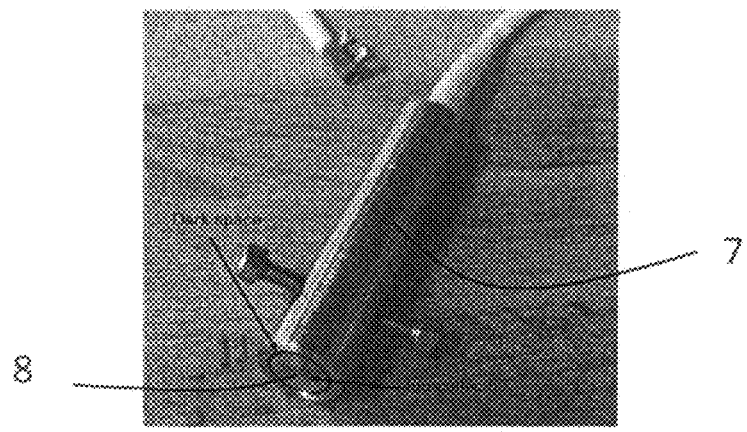
FIG. 6a is a photograph of the plasma probe used to measure ion current density.
Figure 6B:
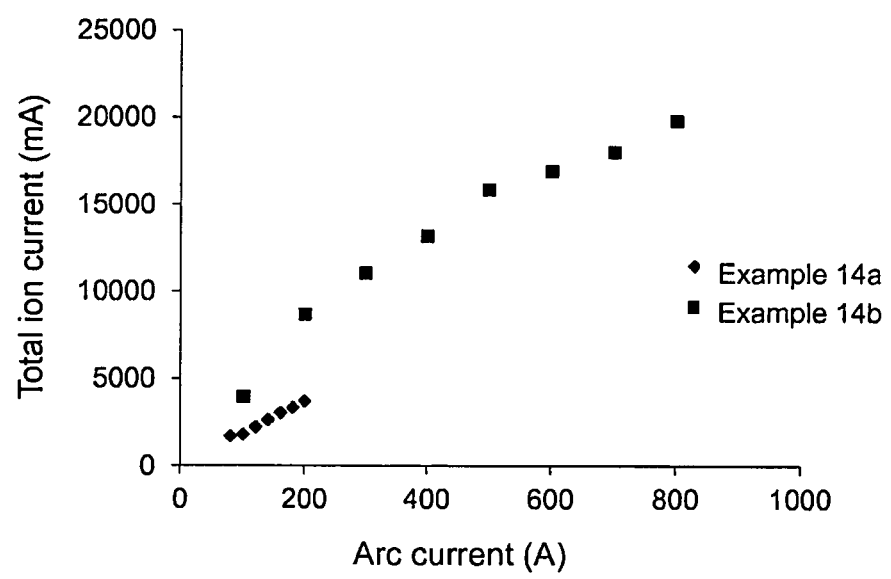
FIG. 6b illustrates total ion current in front of plate-shaped targets of one embodiment of the invention and of prior art determined from plasma probe measurements.

In order to evaluate the total ion current generated by a plate-shaped target in accordance with the present invention a plasma probe was used to measure the ion current density in front of a plate-shaped target. As shown in the photograph of FIG. 5 the plasma probe 7 comprises a cylinder of stainless steel connected in one end by a cable and truncated in the other end by an interior sensor element with a circular sensor surface 8 with a diameter of 1 cm and made of stainless steel. The sensor surface 8 is isolated from the cylinder and hence collects ions from one direction only. A cable in the opposite end of the cylinder connects the cable to an oscilloscope and a power supply. To perform the measurement the plasma probe 7 was placed in front of the plate-shaped target with the sensor surface 8 facing the plate-shaped target 1 at a distance of about 15 cm from the centre of the target surface and the sensor surface 8 was biased at −70 V via the cable. At −70 V the ion current is considered to be saturated and does not vary much with the change in bias voltage. An arc discharge was triggered and the ion current density was measured for different arc currents. This measurement was performed in a conventional deposition system (Balzers Rapid Coating System) with a Ø16 cm $Ti_{40}Al_{60}$ plate-shaped target using arc currents of 80, 100, 120, 140, 160, 180 and 200 A, hereinafter referred to as Example 14a, and in a deposition system in accordance with the present invention with a 74×19 cm² $Ti_{40}Al_{60}$ plate-shaped target using arc currents of 100, 200, 300, 400, 500, 600, 700 and 800 A, hereinafter referred to as Example 14b. The measurements were performed in a nitrogen atmosphere at a pressure of 3.5 Pa and at a temperature of 250° C. and 400° C., respectively. FIG. 6 illustrates the total ion current determined by multiplying the measured ion current density with target size. The ion current of the deposition system using the larger plate-shaped targets is significantly larger than in the conventional deposition system. For an arc current of 180 A the total ion current in the prior art deposition system is 3.3 kA and for an arc current of the deposition system in accordance with the invention is 8.7 kA.

Thicknesses of the deposited coatings were measured by light optical microscopy on polished cross sections. In general the thickness of the coating on the flank side of the coated cutting tool is larger than on the rake side since the inserts have been mounted with the flank side towards the plate-shaped targets. Hence the thickness was measured 0.2 mm from the edge line on each of the flank side and the rake side to reflect this difference. For irregular surfaces, such as those on e.g. drills and end mills, the thicknesses given herein refers to the thickness measured on any reasonably flat surface or a surface having a relatively large curvature and some distance away from any edge or corner. For instance, on a drill, the measurements should be performed on the periphery.

In addition to measurement of composition using EDS or the like the composition of each individual layer can be estimated from the composition of the targets. When thicker layers have been deposited, thick enough to be analysed, it has been shown that the composition of the deposited layers can differ with a few percentage compared to the composition of the target material. Hence the compositions of the coatings are not given in all of the above examples.

Internal stresses of the coatings were measured on the middle of the flank side of the coated cutting tools, more specifically by X-ray diffraction using ψ-geometry on a X-ray diffractometer Bruker D8 Discover-GADDS equipped with laser-video positioning, Euler ¼-cradle, rotating anode as X-ray source ($CuK_\alpha$-radiation) and an area detector (Hi-star). A collimator of size 0.5 mm was used to focus the beam. The analysis was performed on the TiAlN (200) reflection using the goniometer settings 2θ=50°, ω=25° and Φ=0°, 90°, 180°, 270°. Eight ψ tilts ranging from 0° to 70° were performed for each Φ-angle. The $\sin^2\psi$ method was used to evaluate the internal stress using the software DIFFRAC$^{Plus}$ Stress32 v. 1.04 from Broker AXS with the constants Young's modulus, E=450 GPa and Poisson's ratio, ν=0.20 and locating the reflection using the Pseudo-Voigt-Fit function. Hardness of the coatings was measured using nano-indentation.

Terms like in lateral, front, top, in front of, length, width, horizontally etc. are used for illustrative purposes only and are not intended to limit the invention to a specific orientation.

While the invention has been described in connection with what is presently considered to be the most practical and preferred embodiments, it is to be understood that the invention is not to be limited to the disclosed embodiments, on the contrary, it is intended to cover various modifications and equivalent arrangements within the appended claims.

The invention claimed is:

1. A coated cutting tool comprising a substrate and a coating, where the coating comprises at least one compound layer comprising $Ti_{1-x}Al_xN$ wherein $0.5<x<0.7$ or $0.3<x<0.5$, which is deposited by cathodic arc deposition, and which has a thickness of more than 15 μm and up to 30 μm, wherein the coating has compressive stresses of higher than 1.3 GPa and up to 2 GPa as determined by X-ray diffraction analysis using the $\sin^2 \Psi$ method, and wherein said compound layer comprises a gradient with respect to said internal stress, with higher compressive stress towards the outer surface of said compound layer.

2. The coated cutting tool of claim 1, wherein the compound layer has a thickness from 20 μm up to 30 μm.

3. The coated cutting tool of claim 1, wherein the surface areal roughness of the coating with respect to the surface texture parameter Sdr, defining developed area ratio, is less than 10%.

4. The coated cutting tool of claim 1, wherein the surface areal roughness of the coating with respect to the surface texture parameter Spd, defining the density of peaks, is less than $10 \times 10^3/mm^2$.

5. The coated cutting tool of claim 1, wherein the surface areal roughness of the coating with respect to the surface texture parameter Sa, defining the arithmetical mean height of the surface, is less than 0.4 μm.

6. The coated cutting tool of claim 1, wherein the compound layer is $Ti_{1-x}Al_xN$, and wherein $0.5<x<0.7$.

7. The coated cutting tool of claim 1, wherein the compound layer is $Ti_{1-x}Al_xN$, and wherein $0.3<x<0.5$.

8. The coated cutting tool of claim 1, wherein the compound layer is a single layer.

9. The coated cutting tool of claim 1, wherein the compound layer is a multilayer structure.

10. The coated cutting tool of claim 1, wherein the surface areal roughness of the coating with respect to the surface texture parameter Sdr, defining developed area ratio, is less than 6%.

11. The coated cutting tool of claim 1, wherein the surface areal roughness of the coating with respect to the surface texture parameter Sa, defining the arithmetical mean height of the surface, is less than 0.3 μm.

12. The coated cutting tool of claim 1, wherein said substrate is a cemented tungsten carbide substrate (WC) with a sub-micron grain size, 5-13.5 wt % Co, Cr such that the Cr/Co ratio by weight is 0.04-0.15, balanced WC and ppm levels of the elements Ti, Ta, or V.

13. The coated cutting tool of claim 12, wherein the coercivity He of the substrate ranges from 18-30 kA/m.

14. The coated cutting tool of claim 12, wherein the hardness of the substrate HV3 is from 1500 up to 2200 kgf/mm².

15. The coated cutting tool of claim 1, wherein said compound layer is an innermost layer of the coating, closest to the substrate.

16. The coated cutting tool of claim 1, wherein said compound layer is an outermost layer of the coating.

* * * * *